(12) United States Patent
Tanaka

(10) Patent No.: US 7,368,857 B2
(45) Date of Patent: May 6, 2008

(54) PIEZOELECTRIC RESONATOR ELEMENT, PIEZOELECTRIC, RESONATOR, AND PIEZOELECTRIC OSCILLATOR

(75) Inventor: Masako Tanaka, Okaya (JP)

(73) Assignee: Seiko Epson Corporation, Tokyo (JP)

( * ) Notice: Subject to any disclaimer, the term of this patent is extended or adjusted under 35 U.S.C. 154(b) by 349 days.

(21) Appl. No.: 11/068,988

(22) Filed: Mar. 2, 2005

(65) Prior Publication Data
US 2005/0231078 A1    Oct. 20, 2005

(30) Foreign Application Priority Data
Mar. 2, 2004   (JP)   .............. 2004-057590
Nov. 12, 2004  (JP)   .............. 2004-328592

(51) Int. Cl.
*H01L 41/04*   (2006.01)
*H01L 41/08*   (2006.01)
(52) U.S. Cl. .................. 310/333; 310/365; 310/322
(58) Field of Classification Search ............. 310/333, 310/363–366, 370, 322
See application file for complete search history.

(56) References Cited
U.S. PATENT DOCUMENTS
3,745,385 A * 7/1973 Nakajima et al. ........... 310/358
4,451,754 A * 5/1984 Stolz et al. .................. 310/348
5,648,746 A * 7/1997 Kaida ......................... 310/368
2005/0200240 A1 * 9/2005 Tanaka ........................ 310/333

FOREIGN PATENT DOCUMENTS

| JP | U-59-108330   | 7/1984  |
|----|---------------|---------|
| JP | U-59-183025   | 12/1984 |
| JP | A-8-228121    | 9/1996  |
| JP | A-9-93076     | 4/1997  |
| JP | A-2001-257558 | 9/2001  |
| JP | A-2003-46366  | 2/2003  |
| JP | A-2003-124779 | 4/2003  |

* cited by examiner

Primary Examiner—J. San Martin
(74) Attorney, Agent, or Firm—Oliff & Berridge, PLC

(57) ABSTRACT

Exemplary embodiments provide a piezoelectric resonator element, to reduce the reaching of an attenuating vibration of a main vibration to a marginal edge of the piezoelectric resonator element, as well as to stabilize an oscillating-frequency without worsening the CI value, nor inducing another vibration mode. The piezoelectric resonator element having a thickness shear vibration as a main vibration, a first groove and a second groove formed so as to surround the center part of a main surface, and the thickness at the first groove and the second groove structured to be between 70% to 96%, inclusive, of the thickness of the center part of the resonator element.

15 Claims, 18 Drawing Sheets

F I G. 6
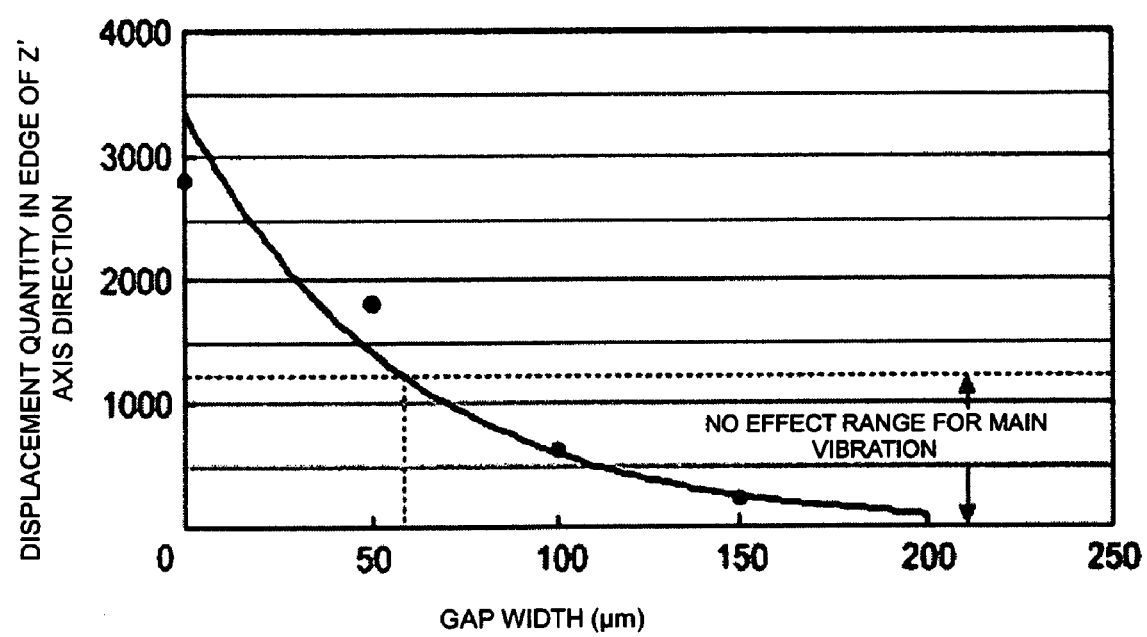

F I G. 15
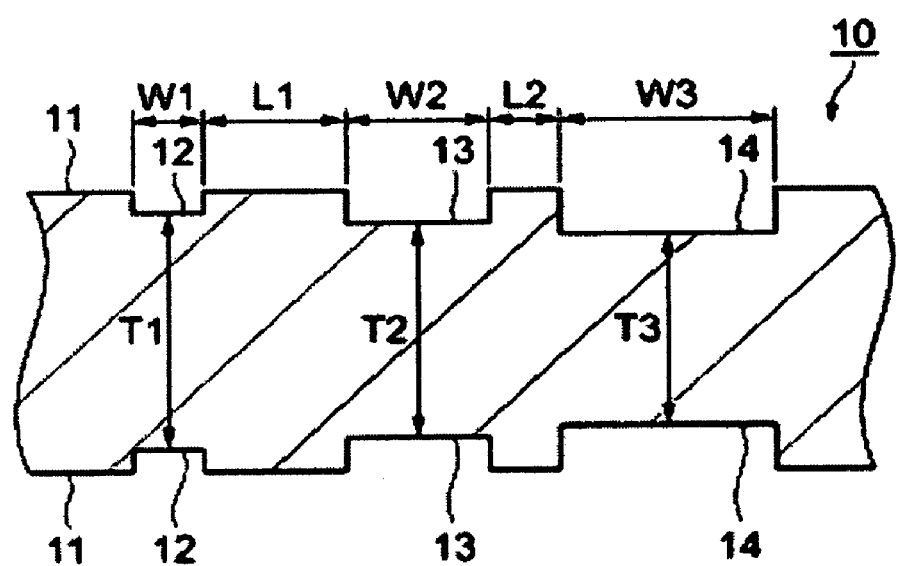

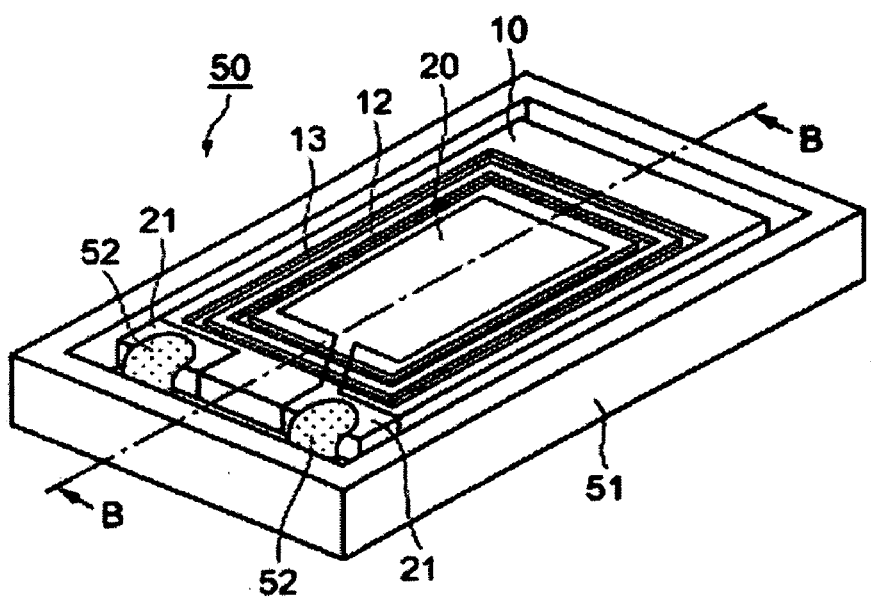
F I G. 17A
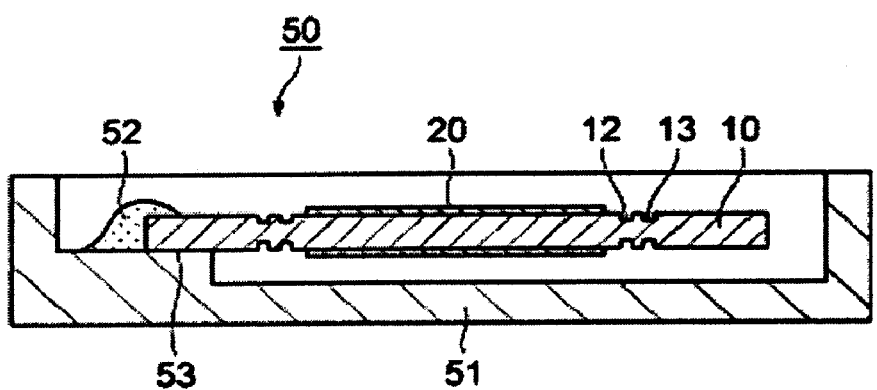
F I G. 17B

PIEZOELECTRIC RESONATOR ELEMENT, PIEZOELECTRIC, RESONATOR, AND PIEZOELECTRIC OSCILLATOR

BACKGROUND

Exemplary embodiments relate to a piezoelectric resonator element, a piezoelectric resonator, and a piezoelectric oscillator; where the piezoelectric resonator element is capable of forming a thickness shear vibration as a main vibration, declining the reaching of an attenuating vibration of the main vibration to a marginal edge of the piezoelectric resonator element, and reducing the vibration displacement in the attenuating vibration of the piezoelectric resonator element.

Related art piezoelectric resonators are widely used as a base-frequency-signal source in various electronic devices or communication devices. Among piezoelectric resonators, AT cut quartz crystal resonators can outstandingly maintain frequency stability in wide range of temperatures, and are outstandingly tolerant against time duration, and hence are widely used for various devices, such as electronic devices and mobile communication devices, etc.

AT cut quartz crystal resonator is commonly used with a thickness shear vibration mode as the main vibration. During the thickness shear vibration, a constant wave is generated right under the excitation electrode that is placed in the center of a resonator element, and the vibration is extracted as a resonance frequency. The vibration generated in the center of the resonator element is propagated to the marginal edge of the resonator element.

Here, it is necessary that the vibration, which is attenuated at the marginal edge of the resonator element, be sufficiently attenuated, so as to assure the electric characteristics necessary as a resonator. The resonator element is fixed and held to a housing container such as one made of ceramics, and the like, via a conductive adhesive, and the like, at the marginal edge of the resonator element. Consequently, if the vibration attenuation at the marginal edge of the resonator element is not sufficient, the vibration leaks out from the fixed portion of the marginal edge of the resonator element. For this reason, the vibration at the center of the resonator element is obstructed, and Crystal Impedance (referred to as "CI value" hereafter) is, generally, worsened. Moreover, another vibration mode is induced and the stability of oscillating-frequency is, generally, lowered.

In order to sufficiently attenuate the attenuating vibration of the thickness shear vibration at the marginal edge of the resonator element, the structure shown in Japanese Unexamined Patent Publication No. H9-93076 and the Japanese Unexamined Patent Publication No. 2001-257558 is disclosed. In this structure, by applying one groove along the outer rim of an excitation electrode, either the vibration at the marginal edge of the resonator element is suppressed, or the electric characteristic of the resonator is enhanced.

SUMMARY

However, in Japanese Unexamined Patent Publication No. H9-93076 and Japanese Unexamined Patent Publication No. 2001-257558 there is a problem because both the critical and the practical values of the depth of the groove in the resonator element are unclear.

Exemplary embodiments provide a piezoelectric resonator element, a piezoelectric resonator, and a piezoelectric oscillator, that enable a practical and sufficient attenuation of the vibration at the marginal edge of the resonator element, do not worsen CI value, nor induce another vibration mode, and have a stable oscillating-frequency.

In order to provide the above, a piezoelectric resonator element, in the exemplary embodiments, includes: main surfaces; a groove formed on at least one of the of main surfaces; the piezoelectric resonator element capable of forming a thickness shear vibration as a main vibration; the groove being formed in a way that one part of the groove faces another part of the groove, the groove sandwiching a center part of the piezoelectric resonator element, and the groove surrounding the center part of the piezoelectric resonator element; a thickness of the piezoelectric resonator element at the groove being between 96% and at least 70% of a thickness of the center part.

With the piezoelectric resonator element of the exemplary embodiments of the present invention, by forming a groove in a way that a part of the groove faces toward another part of the groove and the groove sandwiching or surrounding the center part of the main surface, it is possible to attenuate a thickness shear vibration generated at the center part of the main surface effectively, as well as to reduce the vibration displacement at the marginal edge of the piezoelectric resonator element. Moreover, by setting the thickness of the piezoelectric resonator element at the groove to be between 70% and 96%, inclusive, of the thickness of the center part of the piezoelectric resonator element where the groove is not formed, it is possible to obtain an effective attenuation of the thickness shear vibration. Consequently, in the case where the piezoelectric resonator element is held at its edge, it is possible to reduce the vibration leakage from the holding part. Further, by reducing the vibration leakage, it is possible to obtain the piezoelectric resonator element that enables to reduce the obstruction of a main vibration at the center part of the piezoelectric resonator element, enhances and/or improves CI value, does not induce another vibration mode, and has stable oscillating-frequency.

A piezoelectric resonator element, in exemplary embodiments of the present invention, includes: main surfaces; a groove formed on at least one of the main surfaces; the piezoelectric resonator element capable of forming a thickness shear vibration as a main vibration; the groove being formed in a way that one part of the groove faces another part of the groove, the groove sandwiching a center part of the piezoelectric resonator element, or the groove surrounding a center part of the piezoelectric resonator element; and a thickness at the groove being between 92% and at least 80% of a thickness of the center part.

This way, since a groove is formed in a way that a part of the groove faces another part of the groove, the groove sandwiching or surrounding the center part of the main surface, it is possible to attenuate a thickness shear vibration generated at the center part of the main surface effectively, as well as to reduce the vibration displacement at the marginal edge of the piezoelectric resonator element. Specifically, by setting the thickness of the piezoelectric resonator element at a groove to be between 80% and 92%, inclusive, of the thickness of the center part of the piezoelectric resonator element where the groove is not formed, it is possible to obtain an effective attenuation of the thickness shear vibration. Consequently, in case where the piezoelectric resonator element is held at its edge, it is possible to reduce the vibration leakage from the holding part. Further, by reducing this vibration leakage, it is possible to obtain a desirable piezoelectric resonator element that enables to reduce the obstruction of the main vibration at the center part of the piezoelectric resonator element, enhances and/or improves CI value, and has stable oscillating-frequency without inducing other vibration mode.

Moreover, it is desired that in the piezoelectric resonator element, in exemplary embodiments of the present invention, the grooves be formed in a plurality of rows defined by intervals from the center part of the piezoelectric resonator element toward a marginal edge.

This way, it is possible to gradually attenuate a thickness shear vibration generated at the center part of the main surface effectively, as well as to reduce the vibration displacement at the marginal edge of the piezoelectric resonator element. Furthermore, by gradually attenuating the thickness shear vibration generated at the center part of the main surface, it is possible to control the, generally, drastic attenuation of the vibration that occurs when a single groove is formed, and to reduce the obstruction of the main vibration caused by drastic attenuation of vibration.

Moreover, it is desired that in the piezoelectric resonator element, in exemplary embodiments of the present invention, a plurality of rows of grooves are formed, the width of the groove located at the outermost side of the main surface being larger than or equal to the thickness of the center part.

This way, it is possible to securely attenuate the thickness shear vibration generated, at the center part of the main surface, with the groove formed at the outermost side.

Moreover, it is desired that in the piezoelectric resonator element, in exemplary embodiments of the present invention, if a plurality of rows of grooves are formed, the grooves are structured so that the thickness at each of the grooves sequentially becomes thinner toward the marginal edge of the piezoelectric resonator element.

As the thickness at the groove becomes thinner, there is an attenuation effect of the vibration. This way, it is possible to reduce the attenuation of the vibration at the neighboring part of the center part of the piezoelectric resonator element, and to effectively gradually increase the attenuation of the vibration toward the marginal edge of the piezoelectric resonator element. That is to say, it is possible to moderately control the attenuation of the vibration gradually, so as not to cause drastic attenuation at the part close to the main vibration. As described, it is possible to reduce a, generally, drastic attenuation that obstructs the main vibration, and thus it is possible to obtain a desirable electric characteristic as a piezoelectric resonator element.

Moreover, it is desired that in the piezoelectric resonator element in exemplary embodiments of the present invention, the plurality of grooves are structured in at least three rows, and the distance between the adjacent grooves sequentially narrowing toward the marginal edge of the piezoelectric resonator element.

As the distance between one groove and another becomes narrower, an effect of the vibration attenuation occurs. This way, it is possible to reduce the attenuation of the vibration at the neighboring part of the center part of the piezoelectric resonator element, and to effectively increase the attenuation of the vibration toward the marginal edge of the piezoelectric resonator element. That is to say, it is possible to moderately control the attenuation of the vibration gradually, so as not to cause, generally, drastic attenuation at the part close to the main vibration. As described, it is possible to reduce a drastic attenuation that obstructs the main vibration, and thus it is possible to obtain a desirable electric characteristic of a piezoelectric resonator element.

Moreover, it is desired that in the piezoelectric resonator element, in exemplary embodiments of the present invention, the plurality of grooves are structured so that the widths at each of the grooves sequentially widen toward the marginal edge of the piezoelectric resonator element.

As the width of the groove becomes wider, there is an attenuation effect of the vibration. This way, it is possible to reduce the attenuation of the vibration at the neighboring part of the center part of the piezoelectric resonator element, and to effectively gradually increase the attenuation of the vibration toward the marginal edge of the piezoelectric resonator element. That is to say, it is possible to moderately control the attenuation of the vibration gradually, so as not to cause, generally, drastic attenuation at the part close to the main vibration. As described, it is possible to reduce a drastic attenuation that obstructs the main vibration, and thus it is possible to obtain a desirable electric characteristic as a piezoelectric resonator element.

Moreover, it is desired that in the piezoelectric resonator element, in exemplary embodiments of the present invention, the plurality of grooves are structured so that the thickness at each of the grooves sequentially grows thinner toward the marginal edge of the piezoelectric resonator element, and the widths at each of the grooves sequentially widen toward the marginal edge of the piezoelectric resonator element.

This way, in addition to the effect of the varying thickness at the groove, the effect of the varying width of the groove is added, and hence it is possible not to cause, generally, drastic attenuation at the part close to the main vibration. Consequently, it is possible to reduce the drastic attenuation that obstructs the main vibration, and thus it is possible to obtain a desirable electric characteristic of a piezoelectric resonator element.

Moreover, it is desired that in the piezoelectric resonator element, in exemplary embodiments of in the present invention, the plurality of grooves are structured in at least three rows, a distance separating adjacent grooves, the distance between the adjacent grooves sequentially narrowing toward the marginal edge of the piezoelectric resonator element, and the thickness at each of the grooves being sequentially thinner toward the marginal edge of the piezoelectric resonator element.

This way, in addition to the effect of the varying distance between one groove and another groove, the effect of the varying thickness at the groove is added, and hence it is possible not to cause, generally, drastic attenuation at the part close to the main vibration. Consequently, it is possible to reduce a, generally, drastic attenuation that obstructs the main vibration, and thus it is possible to obtain a desirable electric characteristic of a piezoelectric resonator element.

Moreover, it is desired that in the piezoelectric resonator element, in exemplary embodiments of the present invention, the plurality of grooves are structured in at least three rows, a distance separating adjacent grooves, the distance between the adjacent grooves sequentially narrowing toward the marginal edge of the piezoelectric resonator element, and the widths at each of the grooves sequentially widening toward the marginal edge of the piezoelectric resonator element.

This way, in addition to the effect of the varying distance between one groove and another groove, the effect of the varying width of the groove is added, and hence it is possible not to cause drastic attenuation at the part close to the main vibration. Consequently, it is possible to reduce a, generally, drastic, attenuation that obstructs the main vibration, and thus it is possible to obtain a desirable electric characteristic of a piezoelectric resonator element.

Moreover, it is desired that in the piezoelectric resonator element, in exemplary embodiments of the present invention, the plurality of grooves are structured in at least three rows, a distance separating adjacent grooves, the distance between the adjacent grooves sequentially narrowing toward the marginal edge of the piezoelectric resonator element, the thickness at each of the grooves sequentially being thinner toward the marginal edge of the piezoelectric resonator element, and the widths at each of the grooves sequentially widening toward the marginal edge of the piezoelectric resonator element.

This way, in addition to the effect of the varying distance between one groove and another groove, the effect of the varying thickness as well as width of the groove is added, and hence it is possible not to cause, generally, drastic attenuation at the part close to the main vibration. Consequently, it is possible to reduce, generally, a drastic attenuation that obstructs the main vibration, and thus it is possible to obtain a desirable electric characteristic of a piezoelectric resonator element.

Moreover, the piezoelectric resonator element in, exemplary embodiments of the present invention may be structured to have a pair of excitation electrodes, structured in an arbitrary shape in two center parts of the piezoelectric resonator element, being opposite to each other in a thickness direction, and a connecting electrode, connected to at least one of the pair of excitation electrodes and extending to the marginal edge of the piezoelectric resonator element.

This way, when generating a thickness shear vibration at the center part of the piezoelectric resonator element, as well as fixing and holding the piezoelectric resonator at the marginal edge of the piezoelectric resonator element via a conductive adhesive, and the like, the vibration at the marginal edge thereof is sufficiently attenuated, so that it is possible to suppress the vibration leakage from the fixing and holding portion. Consequently, it is possible to obtain a piezoelectric resonator element with a desirable electric characteristic.

Moreover, it is possible to provide a piezoelectric resonator, having the piezoelectric resonator element in exemplary embodiments of the present invention as well as a holding part that fixes and holds the piezoelectric resonator element so as to be electrically connected at its edge.

As described, the piezoelectric resonator is fixed and held at the edge of the piezoelectric resonator element via a conductive adhesive, and the like, hence it is possible to suppress the vibration leakage from the resonator element toward the holding part, to bring out the effect of the piezoelectric resonator element that has a groove formed on the main surface, and to provide the piezoelectric resonator with a, generally, excellent electric characteristic.

Moreover, it is possible to provide a piezoelectric oscillator, having the above-mentioned piezoelectric resonator element, a circuit part so as to oscillate the piezoelectric resonator element, and a holding part that fixes and holds the piezoelectric resonator element at its edge while electrically connecting the piezoelectric resonator element to the circuit part.

As described, the piezoelectric oscillator is fixed and held at the marginal edge of the piezoelectric resonator element via a conductive adhesive, and the like, hence it is possible to suppress the vibration leakage from the resonator element toward the holding part, to bring out the effect of the piezoelectric resonator element that has a groove formed on the main surface, and to provide the piezoelectric oscillator with a, generally, excellent electric characteristic.

In exemplary embodiments of the present invention, the thickness of the resonator element at the groove is defined, although at the same time, definition of the depth of the groove has the same meaning. That is to say, a piezoelectric resonator element in exemplary embodiments of the present invention has main surfaces; and a groove formed on at least one of the main surfaces; the piezoelectric resonator element capable of forming a thickness shear vibration as a main vibration; the groove may be formed in a way that, one part of the groove faces another part of the groove, the groove sandwiching a center part, or the groove surrounding a center part; and if the groove is formed only on one of the main surfaces of the piezoelectric resonator element, the depth of the groove may be structured to be between at least 4% and 30% of a thickness of the center part. Moreover, if grooves of a same depth are formed on both of the main surfaces of the piezoelectric resonator element, being opposite to each other in a thickness direction, the depth of the groove formed on one of the main surfaces may be structured to be between 2% and 15%, inclusive, of the thickness of the center part.

Further, in order to increase the effect of forming the groove, the piezoelectric resonator element in exemplary embodiments of the present invention has main surfaces; and a groove formed on at least one of the main surfaces; the piezoelectric resonator element capable of forming a thickness shear vibration as a main vibration; the groove may be formed in a way that, on the main surfaces, one part of the groove faces another part of the groove, the groove sandwiching a center part, or the groove surrounding a center part; and if the groove is formed only on one of the main surfaces of the piezoelectric resonator element, the depth of the groove may be structured to be between 8% and 20%, inclusive, of the center part. Additionally, if grooves of a same depth are formed on both of the main surfaces, being opposite to each other in the direction of the thickness, the depth of the groove formed on one of the main surfaces may be structured to be between 4% and 10%, inclusive, of the thickness of the center part.

BRIEF DESCRIPTION OF THE DRAWINGS

FIG. 6 is a correlation map showing the width of the resonator element, as well as the displacement at the edge of the Z' axis direction;

FIG. 15 is a partially enlarged drawing of FIG. 14C;

FIGS. 17A and 17B are schematics of the piezoelectric resonator; and

DETAILED DESCRIPTION OF EMBODIMENTS

Figure 1A:
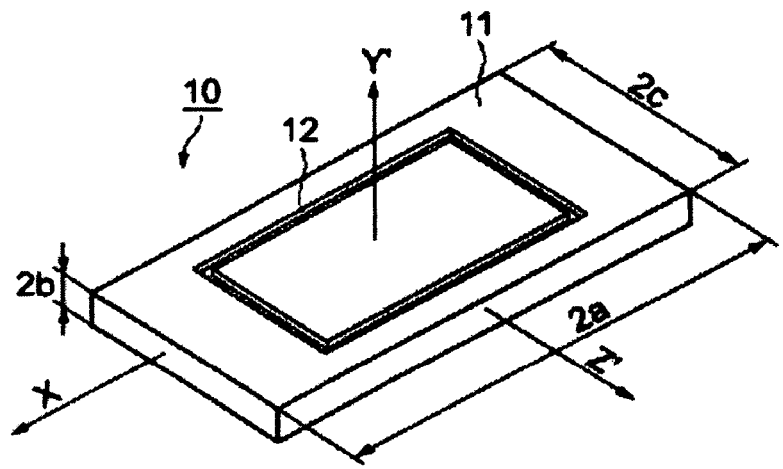
FIGS. 1A, 1B, and 1C are schematic drawings of a quartz crystal resonator element showing one embodiment.

Exemplary embodiments will now be described in detail. Prior to that, the principle of the exemplary embodiment is described using the AT cut quartz crystal resonator element (referred to as a "resonator element" hereafter).

The propagation of the thickness shear vibration is expressed in the following mathematical formulas 1 through 4. According to the mathematical formulas 1 through 4, in the case where there are areas on the resonator element with different frequencies, the vibration propagates from the higher frequency area to the lower frequency area, while the vibration does not propagate from the lower frequency area to the higher frequency area since α and β become an imaginary number, and thus it attenuates. That is to say, in the common resonator element, whereon an excitation electrode is formed, the thickness shear vibration does not propagate, but attenuates from the part that has the excitation electrode with a low frequency to the marginal edge that does not have the excitation electrode with a high frequency.

Formula 1

$$U = B \cdot \exp[-j(\omega t - (\alpha x + \beta z'))] \quad (1)$$

Formula 2

$$\alpha x = \left(\frac{\pi x}{2b}\right)\left(\frac{\gamma_{11}}{C_{66}} + \frac{\pi^2}{12}\right)^{-\frac{1}{2}} \left[\left(\frac{\omega}{\omega_s}\right)^2 - 1\right]^{\frac{1}{2}} \quad (2)$$

Formula 3

$$\gamma_{11} = \frac{s_{33}}{s_{11}s_{33} - s_{13}^2} \quad (3)$$

Formula 4

$$\beta z' = \left(\frac{\pi z'}{2b}\right)\left(\frac{C_{66}}{C_{55}}\right)^{\frac{1}{2}} \left[\left(\frac{\omega}{\omega_s}\right)^2 - 1\right]^{\frac{1}{2}} \quad (4)$$

U: displacement of the thickness shear vibration in the direction of X and Z'

B: amplitude intensity

ω, ωs: angular frequencies for mesa portion, as well as for resonator element

α, β: propagation constants for X and Z' directions respectively

C55 and C66: elastic stiffness (constants in a matrix expressing elastic stiffness in the prescribed crystal direction)

s11, s13 and s33: elastic compliance (constants in a matrix expressing elastic stiffness in the prescribed crystal direction)

j: imaginary number unit t: time x: distance in the X direction z: distance in the Z' direction The inventor of the exemplary embodiments created a part with a high frequency by forming a groove on the resonator element, using the above formulas, and effectively conducted the attenuation of the vibration at the marginal edge of the resonator element. Moreover, the inventor took into consideration not only the attenuation of the vibration at the marginal edge of the resonator element, but also an electric characteristic as the resonator element.

That is to say, the inventor of the exemplary embodiments analyzed the optimal thickness at the groove in the resonator element (thickness of the groove), by taking into consideration the aspect of sufficiently attenuating the vibration at the marginal edge of the resonator element, as well as the problem of unwanted mode generation, which occurs if the low frequency area is mechanically and entirely separated, with the Finite Element Method (FEM) using the above formulas 1 through 4.

Hereafter, specific exemplary embodiments, based on the above-mentioned principle, are described for an AT cut quartz crystal resonator element. The following drawings are not to scale, for the sake of explanation.

The First Exemplary Embodiment

Figure 1B:
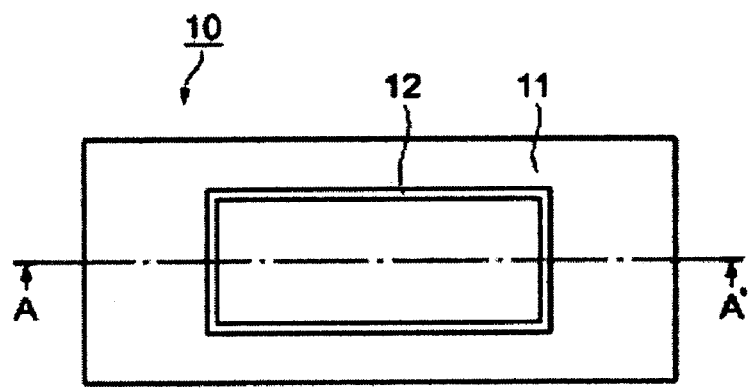
Figure 1C:
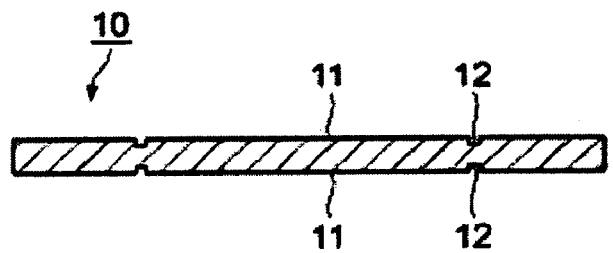
Figure 2:
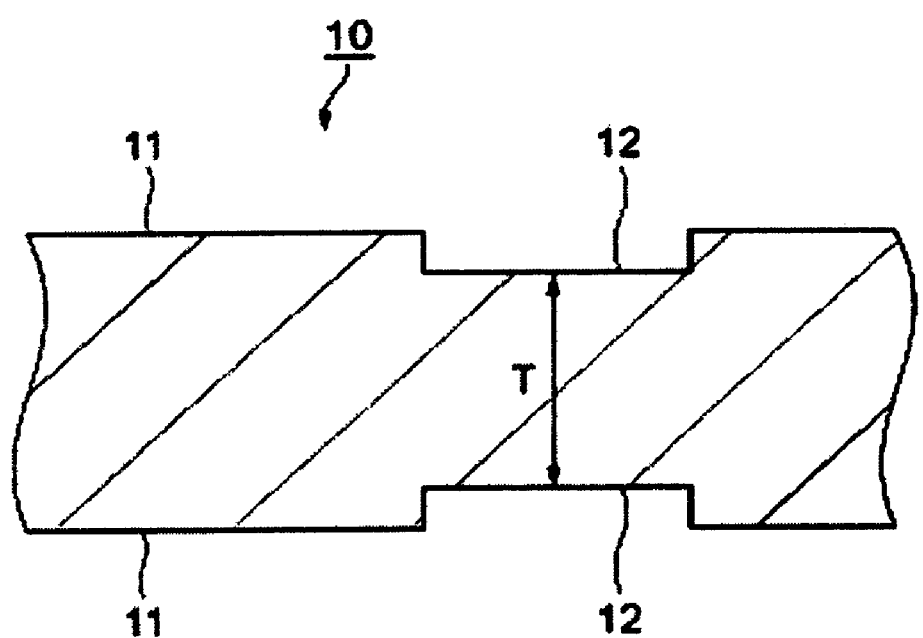
FIG. 2 is a partially enlarged sectional drawing of FIG. 1C.

FIGS. 1A-1C and FIG. 2 are schematic drawings of the resonator element describing the first exemplary embodiment. FIG. 1A is a perspective view of the resonator element, FIG. 1B is a top view of the resonator element, FIG. 1C is a sectional drawing of section A-A in FIG. 1B and FIG. 2 is an enlarged drawing of the groove in FIG. 1C.

A resonator element 10, which serves as a piezoelectric resonator element, is designed to have, for example, 27 MHz of resonance frequency, a side X ratio 33 (the ratio of the size in the direction of the X axis of the resonator element against its thickness), and a side Z ratio 21 (the ratio of the size in the direction of the Z' axis of the resonator element against its thickness). Here, the thickness of the center part of the resonator element 10 is about 62 μm.

The Y' and Z' axes of the resonator element 10 are the new axes made by rotating around the X axis toward the positive direction of X, clockwise, by 35.25 degrees, in accordance with the definition of crystal axis set by the International Electro-technical Commission (IEC) standard. The resonator element 10 is a rectangular shaped slab having a thickness of 2b in the direction of Y' axis, and has main surfaces 11 on both front and back sides, with a size 2a in the direction of X axis that crosses Z' axis at right angles, and with a size 2c in the direction of Z' axis that crosses X axis at right angles.

In the main surface 11 of the resonator element 10, a circumference groove 12 is formed so as to surround the center part of the main surface 11 with quadrangle. The grooves 12 are formed on the front and back main surfaces of the quartz crystal resonator element 10 so as to be opposite to each other, and the width of the grooves 12 are formed to be 65 μm, which is a value larger than the thickness of the resonator element 10. Further, the depth of the grooves 12 is 3 μm for both front and back, and the thickness of the resonator element in the groove 12 is formed to be about 56 μm.

Hereafter, the analysis result conducted by the Finite Element Method (FEM), which lead to the exemplary embodiments of the above-mentioned resonator element is described.

In the present exemplary embodiment, the resonator element with a resonance frequency of 27 MHz, the side X ratio 33, and the side Z ratio 21 is used as a model, and the vibration analysis by the Finite Element Method is conducted, based on the formulas 1 through 4. The analysis result thereof is described hereafter.

Figure 3:
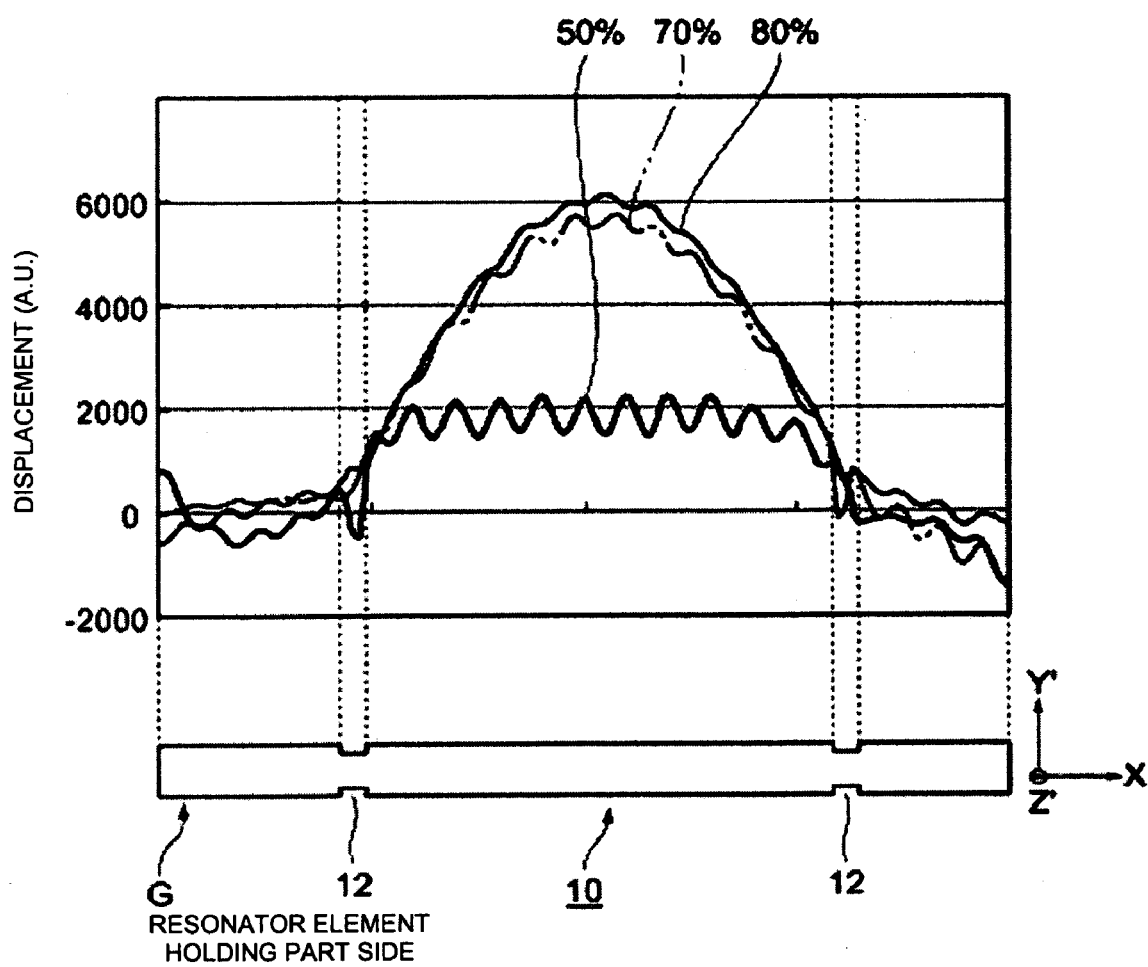
FIG. 3 is a displacement distribution map of the analysis done by the Finite Element Method, showing the attenuation status of the thickness shear vibration.

FIG. 3 shows the result of the calculation of the vibration displacement in the direction of X axis against the variation of the thickness of the resonator element 10 at the groove 12 using the Finite Element Method (FEM), in the case where the grooves 12 are formed on both the front and back of the resonator element 10, so as to sandwich the center parts of the main surfaces in a quadrangle. In FIG. 3, the vibration displacement results, when the thickness of the resonator element 10 at the groove 12 (a size T in FIG. 2) is set to 80%, 70%, and 50% of the thickness of the center part of the resonator element (thickness of the part where the grooves are not formed), are shown. The vertical axis in FIG. 3 is expressed with an arbitrary unit in order to compare the displacement quantity of the vibration. Moreover, the horizontal axis shows the length of the resonator element 10 in the direction of the X axis.

As described, if the thickness T of the resonator element 10 at the groove 12 is set to 80% or 70% of the thickness of the center part of the resonator element, the thickness shear vibration has the maximum displacement at the center part of the resonator element 10, and it attenuates as it reaches the marginal part. Here, by forming the groove 12, it is possible to reduce the vibration displacement at the marginal edge of the resonator element 10, specifically at a resonator element holding part G. Furthermore, when comparing the case where the thickness T at the groove 12 is set to 80% to the case where it is set to 70%, it is understood that the former has the larger maximum displacement at the center part of the resonator element 10. This displacement is related to CI value. The larger the displacement is, the smaller the CI value gets, and the resonator element shows a desirable electric characteristic.

However, if the thickness of the resonator element 10 at the groove 12 is set to 50% of the thickness of the center part of the resonator element, the displacement of the thickness shear vibration at the center part becomes smaller. In other words, this means that as the CI value increases, the electric characteristic of the resonator element worsens. As described, it is understood that there is a critical value for the thickness of the resonator element at the groove, and that there is an optimal thickness of the resonator element at the groove. As described above, if the thickness T of the groove 12 is at least 70% of the thickness of the center part of the piezoelectric resonator element, it is possible to sufficiently attenuate the vibration at the marginal edge of the resonator element 10, as well as to stabilize the oscillating-frequency without, generally, worsening the CI value, nor inducing another vibration mode.

Figure 4:
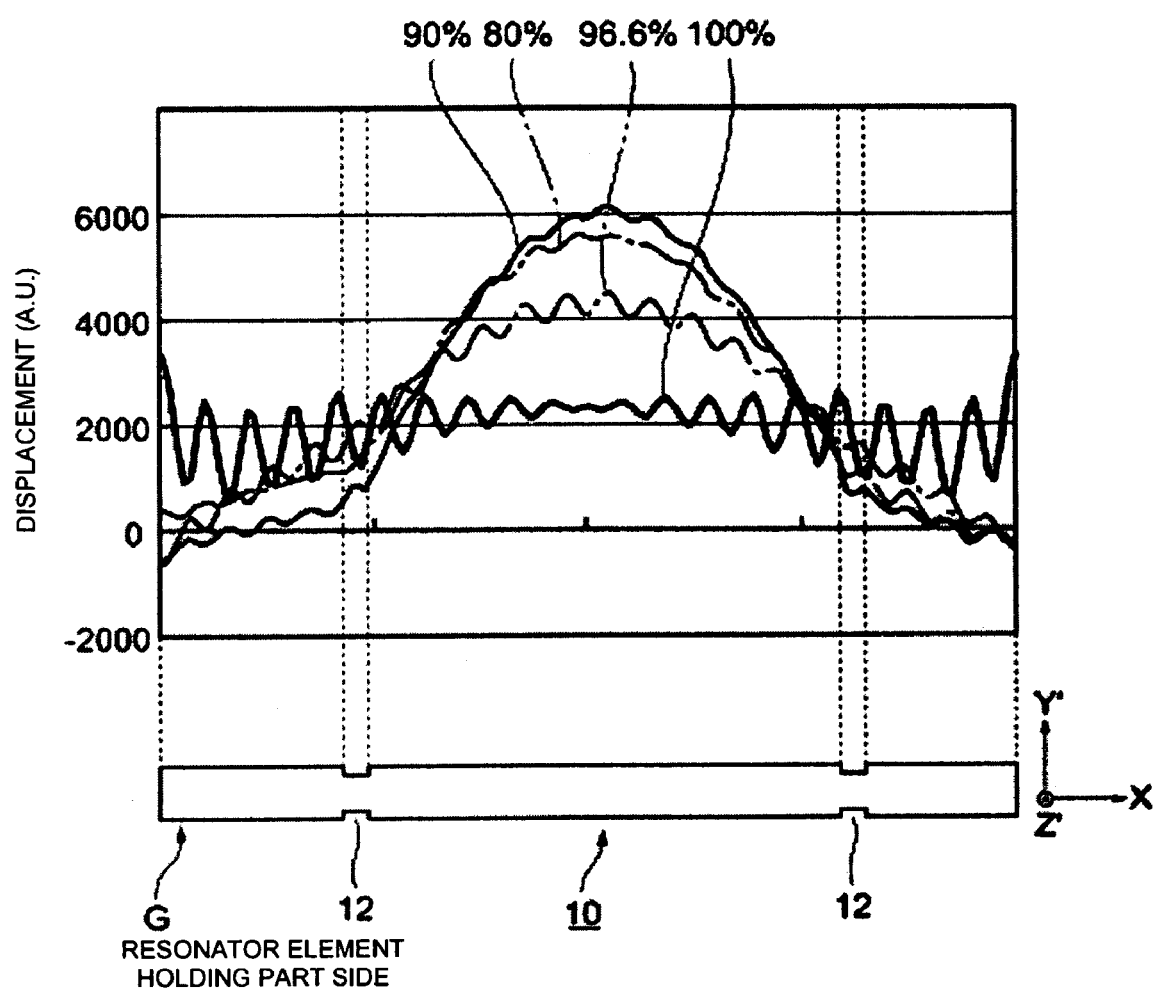
FIG. 4 is a displacement distribution map of the analysis done by the Finite Element Method, showing the attenuation status of the thickness shear vibration.

In FIG. 4, as in FIG. 3, the vibration displacement calculation results, when the thickness of the resonator element at the groove 12 (the size T in FIG. 2) is set to 100% (no groove formed), 96.6%, 90%, and 80% of the thickness of the center part of the resonator element (thickness of the part where the grooves are not formed) are shown.

According to this result, if no groove is formed, the thickness shear vibration displacement is small at the vicinity of the center part of the resonator element, and a characteristic of a resonator element cannot be secured, since the displacement at the resonator element holding part G is large. If the thickness of the resonator element at the groove 12 is set to 96.6%, 90%, or 80% of the thickness of the center part of the resonator element, the effect of forming the groove 12 emerges, and the vibration displacement at the resonator element holding part G is lightly attenuated. Moreover, it is understood that the maximum displacement of the thickness shear vibration, at the vicinity of the center part of the resonator element 10, increases as the thickness of the resonator element at the groove 12 shifts from 96.6% to the vicinity of 90% of the thickness of the center part of the resonator element, and decreases slightly as the thickness thereof shifts from the vicinity of 90% to 80%. The result shows, that, for practical use, when the thickness of the resonator element at the groove 12 is set to around 96.6% of the thickness of the resonator element, if the vibration displacement is obtained, there is minimal problem with the electric characteristic of the resonator element.

Figure 5:
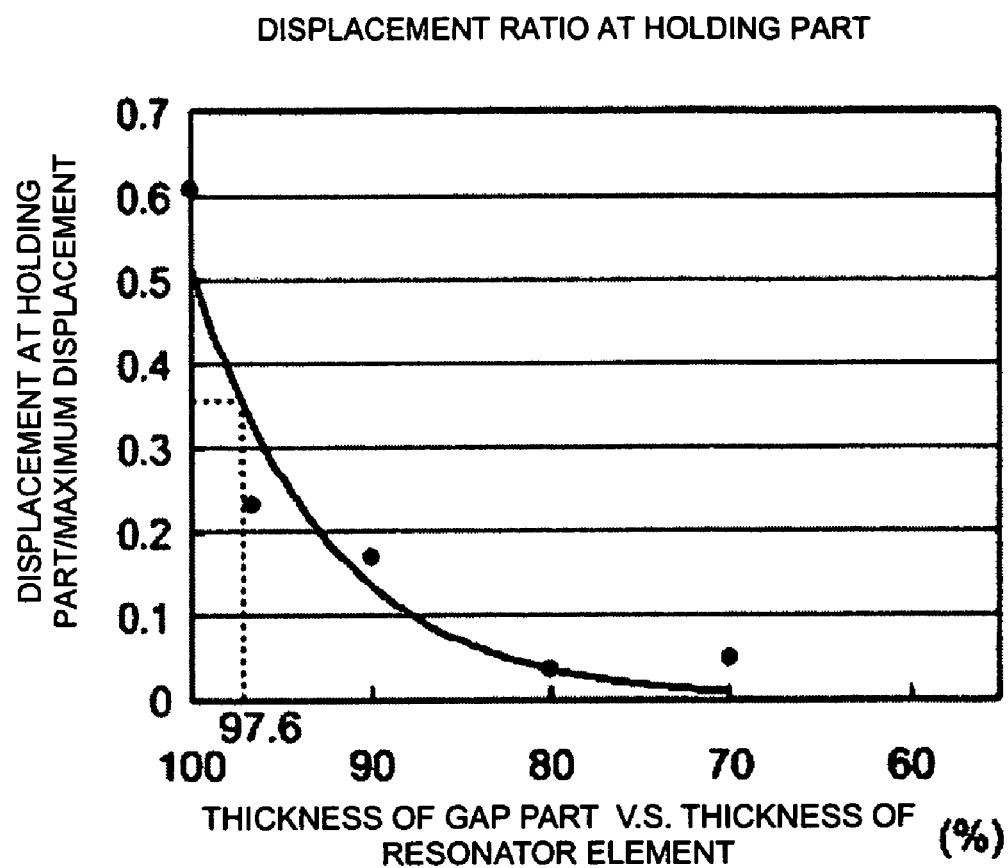
FIG. 5 is a correlation map showing the ratio of displacement at the holding part.

Further, FIG. 5 shows the relation between the displacement ratio (displacement of the resonator element holding part/maximum displacement at the center part of the resonator element) at the resonator element holding part and the thickness of the resonator element at the groove.

As for the ratio at the resonator element holding part, a smaller value is desirable. Moreover, a CI value that is low enough for practical use can be obtained from a prototype, when, in the sample, the attenuation at the holding part of the resonator element is 1/e (e being a natural logarithm base). Here, the thickness of the resonator element at the groove is 97.6%. As described above, if the thickness T of the groove 12 is 96% or less of the thickness of the center part of the piezoelectric resonator element, it is possible to sufficiently attenuate the vibration at the marginal edge of the resonator element 10, as well as to stabilize the oscillating-frequency without, generally, worsening the CI value, nor inducing another vibration mode.

As described above, from the analysis result done by the Finite Element Method shown in FIG. 3 through FIG. 5, if the thickness T of the groove 12 is between 70% and 96%, inclusive, of the thickness of the center part of the resonator element, it is possible to obtain the piezoelectric resonator element with a stable oscillating-frequency that does not, generally, worsen the CI value, nor induce another vibration mode.

Furthermore, in a groove processing, etching by liquid phase or vapor phase may supposedly be conducted. In those processes, processing dispersion occurs and the displacement ratio at the holding part dramatically fluctuates. Consequently, in order for the displacement ratio to fit into the intended range even when the displacement ratio fluctuates, it is desirable to make the thickness of the resonator element at the groove 12 to be 92% or less.

Additionally, according to the attenuation curve in FIG. 5, the attenuation is saturated when the thickness at the groove is 80% or more, and thus the thickness should be set to 80% or more.

As described above, if the thickness T of the groove 12 is between 80% and 92%, inclusive, of the thickness of the center part of the resonator element, it is possible to obtain the desirable piezoelectric resonator element with a stable oscillating-frequency that does not, generally, worsen the CI value, nor induce another vibration mode.

Hereafter, the relationship of the displacement at the edge of the resonator element in the direction of the Z' axis and the width of the groove is shown in FIG. 6.

According to this result, the groove width, where the disposition quantity at the edge of the resonator element in the direction of the Z' axis can be attenuated to the level so as not to effect the main vibration, is 60 μm or more. The groove width of about 60 μm almost matches the thickness of the resonator element. Moreover, while not shown, in the correlation to other frequencies, it has been confirmed that the groove width, where the disposition quantity at the edge of the resonator element in the direction of the Z' axis can be attenuated to the level so as not to, generally, effect the main vibration, almost matches the thickness of the resonator element.

Consequently, by making the groove width equal to or larger than the thickness of the resonator element, it is possible to attenuate the vibration to the level that the displacement at the marginal edge of the resonator element does not, generally, effect the main vibration.

In the present exemplary embodiment, the grooves are applied so as to be opposite to each other, while it is also possible that the groove is applied only on one of the surfaces of the main surfaces, of the resonator element.

Figure 7A:
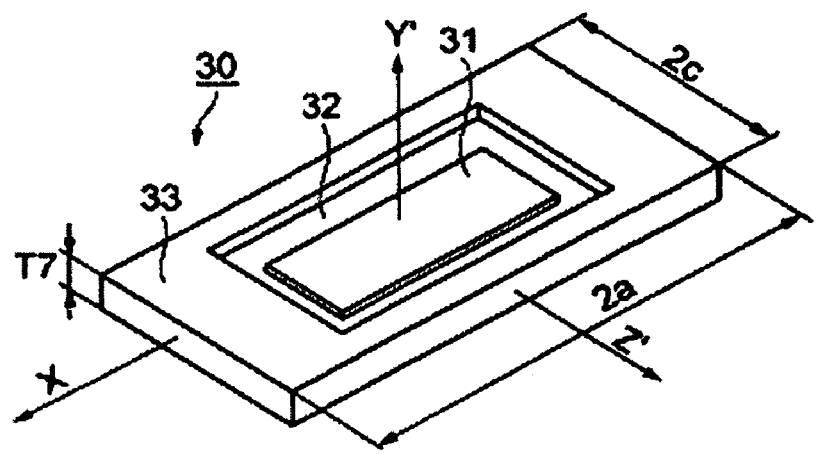
FIGS. 7A, 7B, and 7C are schematics of a quartz crystal resonator element, showing a modification of the exemplary embodiment.
Figure 7B:
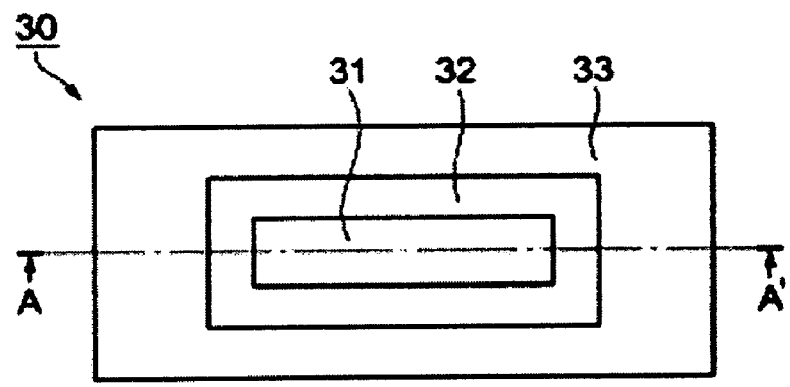
Figure 7C:
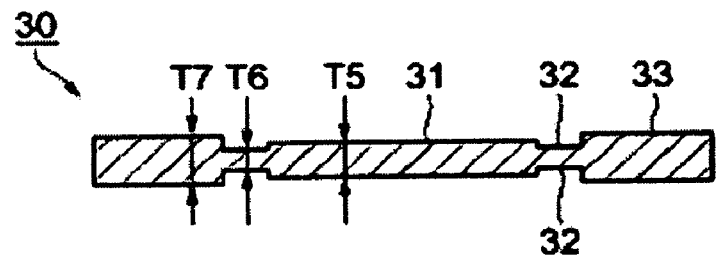

FIGS. 7A-7C is a schematic drawing of a resonator element showing the modification of the resonator element that is provided with grooves. FIG. 7A is a perspective view of the resonator element, FIG. 7B is a top view of the resonator element, FIG. 7C is a sectional drawing of section A-A in FIG. 7B.

The Y' and Z' axes of a resonator element 30 are the new axes made by rotating around X axis toward the positive direction of X, clockwise, by 35.25 degrees, in accordance with the definition of crystal axis set by the International Electro-technical Commission (IEC) standard.

The resonator element 30 has a rectangular shape, with a size 2a in the direction of the X axis that crosses the Z' axis at right angles, a size 2c in the direction of the Z' axis that crosses the X axis at right angles, and an outer part 33 with thickness T7. In the center of the resonator element 30, a rectangular shaped center part 31 with thickness T5 is formed, and grooves 32 with thickness T6 are formed, surrounding the center part 31. Moreover, in the outer circumference of the grooves 31, the outer part 33 with the thickness T7 is formed. The thickness T5 of the center part 31, the thickness T6 at the grooves 32, and the thickness T7 of the outer part 33 are formed in a relation of T6<T5<T7. More specifically, T5 is 62 μm, T6 is 56 μm, and T7 is 100 μm, by design. Further, the width of the grooves 32 is formed to be 65 μm, which is a larger value than the thickness of the center part 31 of the resonator element 30.

In such a structure, a thickness shear vibration, excited at the center part 31 of the resonator element 30 and propagated to the outer circumference of the resonator element, is attenuated at the grooves 32. If the thickness of the grooves 32 is formed to be between 70% and 96%, inclusive, of the thickness of the center part 31, then an attenuation vibration effect occurs. Moreover, by forming the width of the grooves 32 to be larger than the thickness of the center part 31, it is possible to securely attenuate the thickness shear vibration, and thus even if the outer part 33 formed in the outer circumference of the grooves 32 is formed to be thicker than that of the center part 31, the vibration propagation can be ignored.

In the above-mentioned structure, it is possible to sufficiently attenuate the vibration at the marginal edge of the resonator element 30, as well as to stabilize the oscillating-frequency without, generally, worsening the CI value, nor inducing another vibration mode.

Figure 8A:
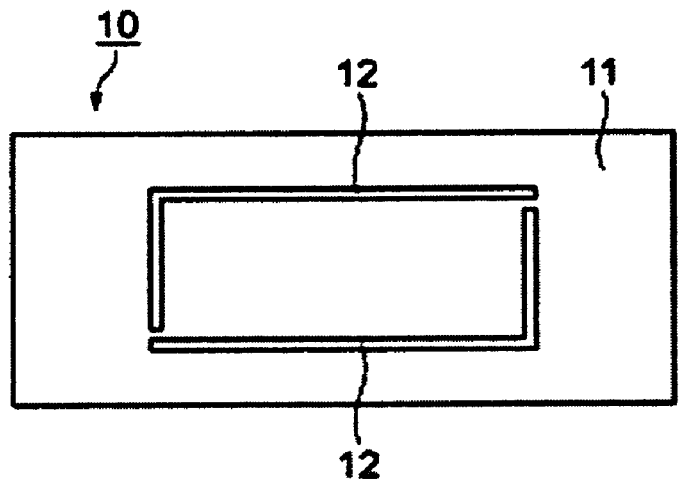
FIGS. 8A, 8B and 8C are schematics showing another exemplary embodiment of the groove.
Figure 8B:
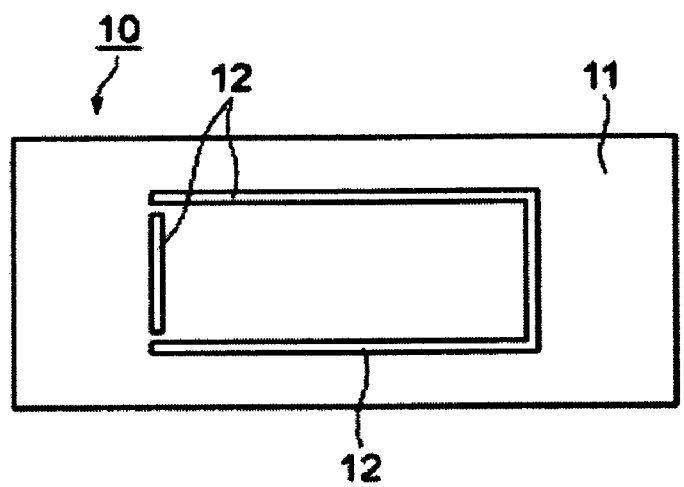
Figure 8C:
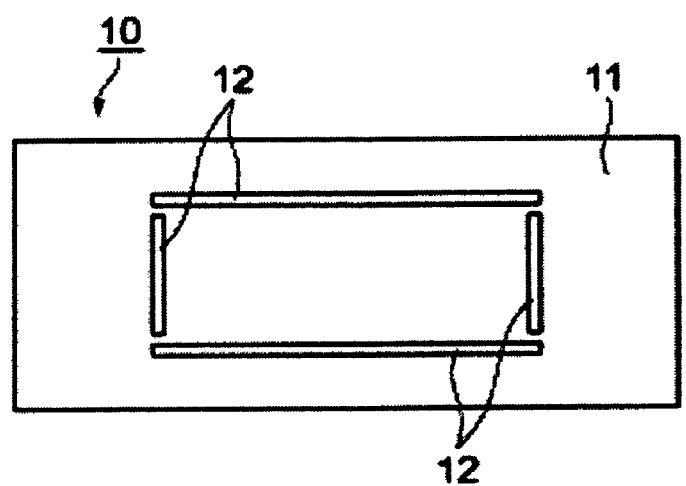

In the present exemplary embodiment, the center part is surrounded continuously in circumference with a quadrangle shaped groove, while the center part of the resonator element 10 may be surrounded by grooves 12, as shown in FIG. 8A, FIG. 8B and FIG. 8C.

Figure 9A:
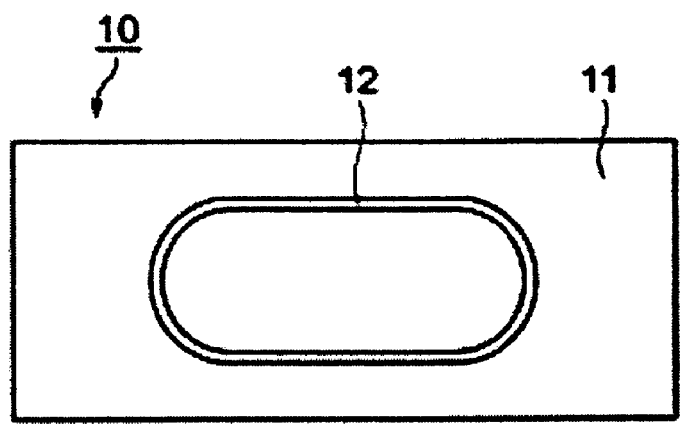
FIGS. 9A, 9B and 9C are schematics showing another exemplary embodiment of the groove.
Figure 9B:
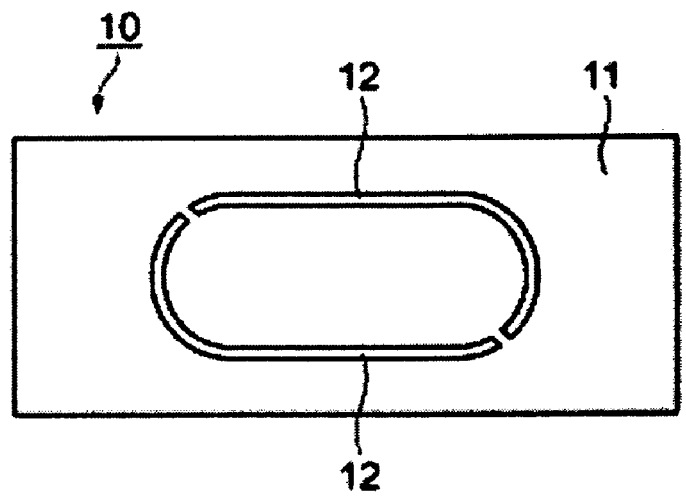
Figure 9C:
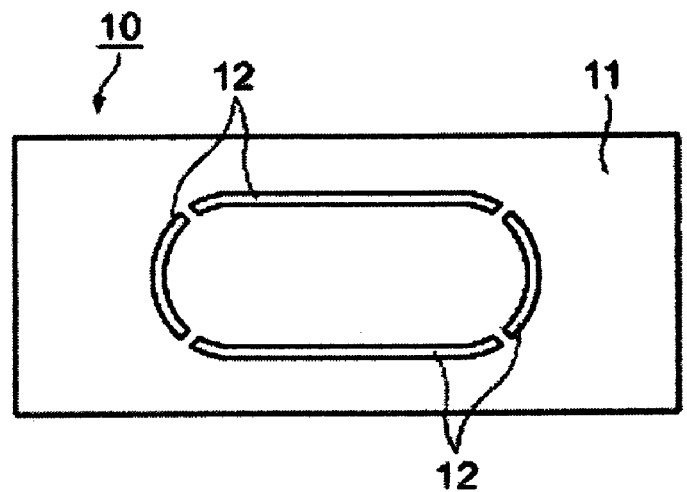

Moreover, as shown in FIG. 9A, grooves may be formed as a track-shape that continuously surrounds the center part of the resonator element 10. Moreover, as shown in FIG. 9B and FIG. 9C, the grooves 12 may be formed as a track-shape that surrounds the center part of the resonator element 10.

The Second Exemplary Embodiment

Hereafter, the second exemplary embodiment, where two grooves are provided in a resonator element, is described.

Figure 10A:
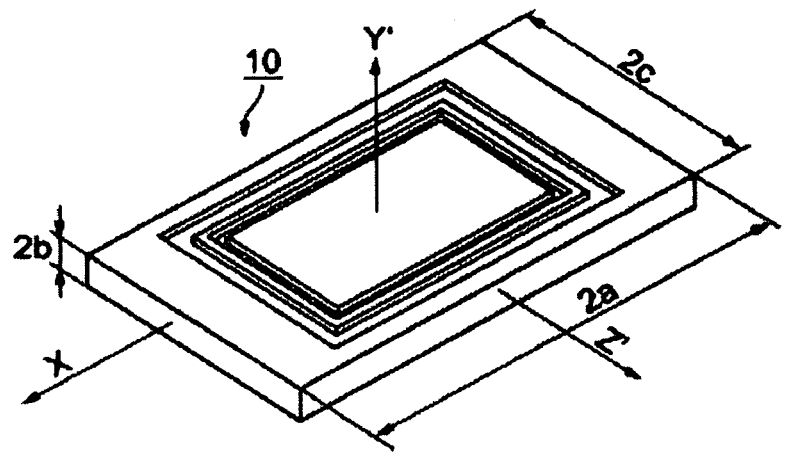
FIGS. 10A, 10B and 10C are schematics of a quartz crystal resonator element describing another exemplary embodiment.
Figure 10B:
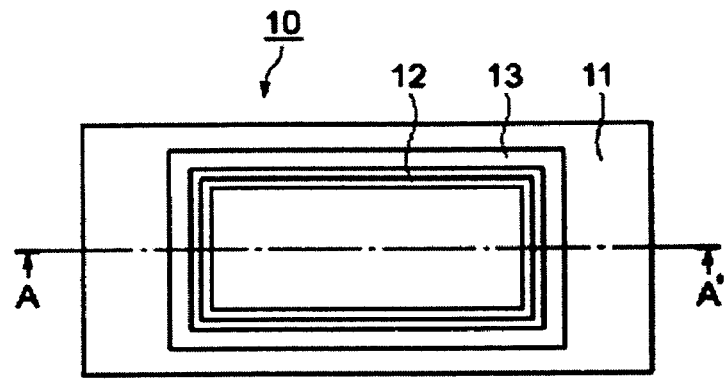
Figure 10C:
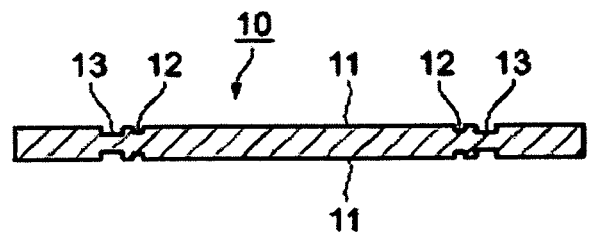
Figure 11:
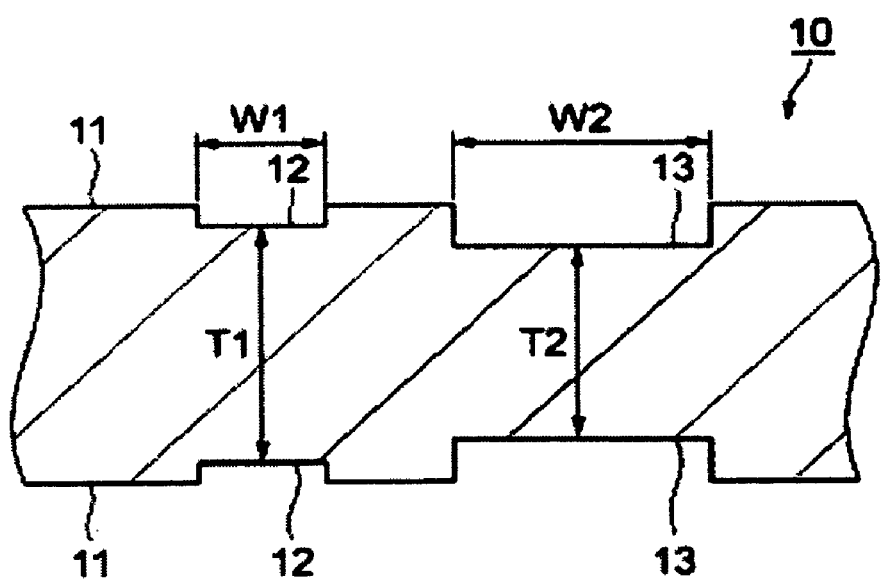
FIG. 11 is an enlarged sectional drawing of FIG. 10C.

FIGS. 10A-10C and FIG. 11 are schematics of the resonator element describing the second exemplary embodiment. FIG. 10A is a perspective view of the resonator element, FIG. 10B is a top view of the resonator element, FIG. 10C is a sectional drawing of the section A-A in FIG. 10B, and FIG. 11 is an enlarged drawing of the groove part in FIG. 10C.

In FIGS. 10A-10C and FIG. 11, the same drawing elements are used for the same structure as those in the first exemplary embodiment.

In the main surface 11 of the resonator element 10, circumference grooves, which are the first groove 12 as well as the second groove 13, are formed so as to surround the center part of the main surface 11 with a quadrangle. The first grooves 12 as well as the second grooves 13 are formed on the front and back of the main surfaces of the resonator element 10 so as to be opposite to each other. A width W1 of the first groove 12 is formed to be about 30 μm, and a width W2 of the second groove 13 located on the outermost side of the main surface 11 of the resonator element 10, is formed to be 65 μm, which is a larger value than the thickness of the resonator element 10 (having a relation of W1<W2).

Further, the depth of the first grooves 12 is 3 μm for both front and back, and a thickness T1 of the resonator element at the first groove 12 is formed to be about 56 μm. The depth of the second grooves 13 is 5 μm for both front and back, and a thickness T2 of the resonator element at the second groove 13 is formed to be about 52 μm (having a relation of T1>T2).

As described above, the widths of the grooves widen gradually toward the marginal edge of the resonator element, while the thicknesses at the grooves become thinner toward the marginal edge of the resonator element.

Figure 12A:
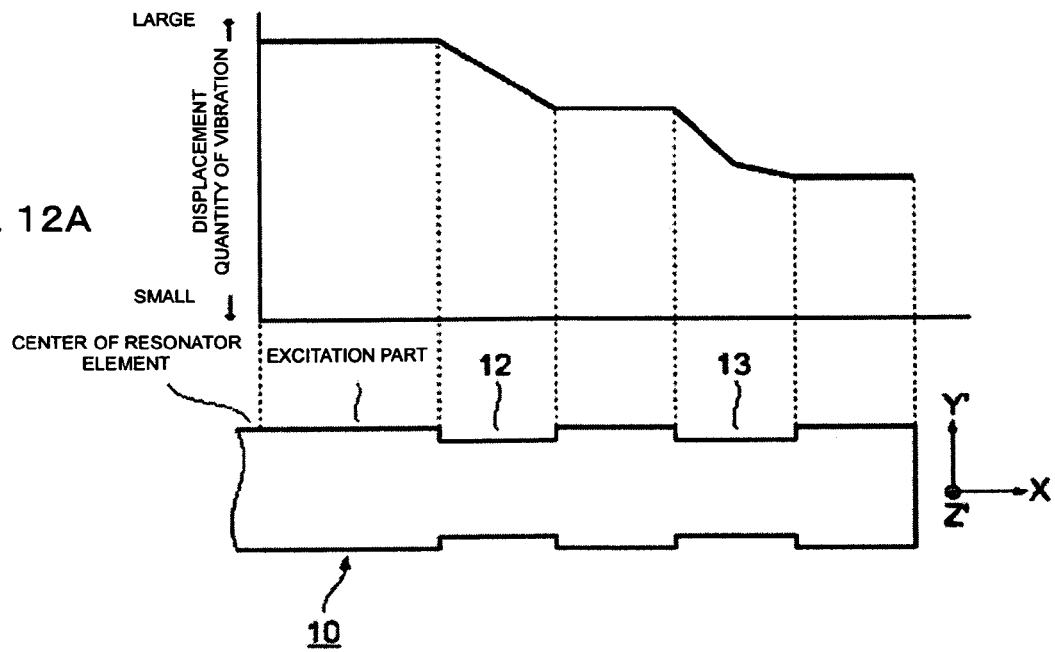
FIGS. 12A and 12B are schematic pattern diagrams showing the vibration attenuation status.
Figure 12B:
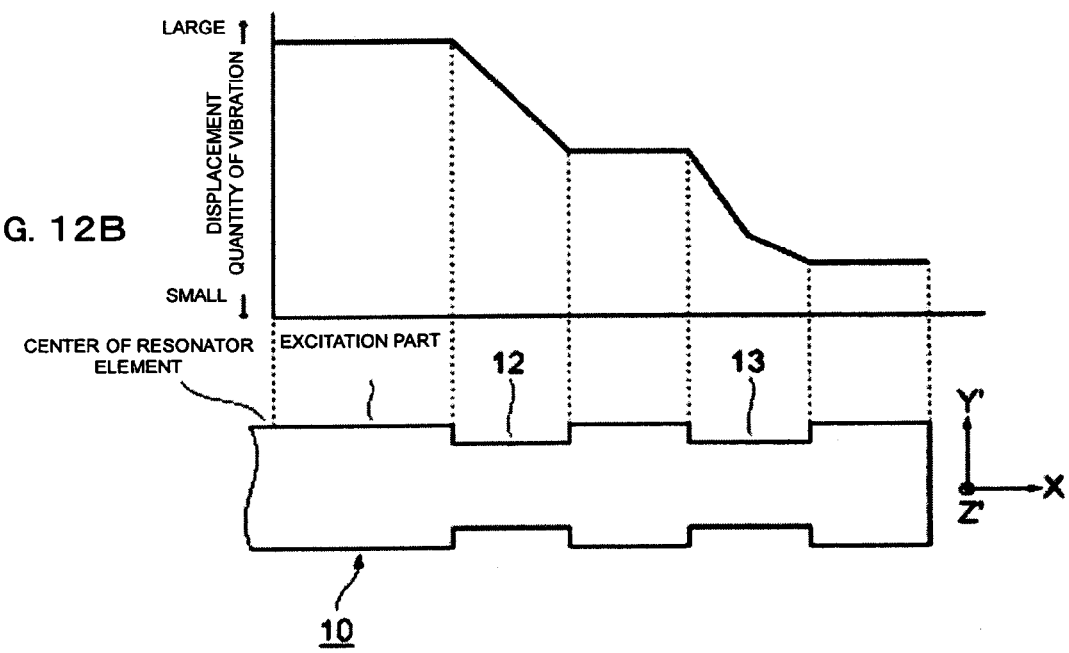

FIG. 12A and FIG. 12B are the schematic pattern diagrams showing the vibration attenuation status of the resonator element 10, in the case where the first grooves 12 as well as the second grooves 13 are formed in the same depth and width.

FIG. 12A shows the case where, for example, the thickness of the resonator element at the groove is made to be 98% of the thickness of the center part of the resonator element (depth of the groove is formed to be shallow). FIG. 12B shows the case where, for example, the thickness of the resonator element at the groove is made to be 90% of the thickness of the center part of the resonator element (depth of the groove is formed to be deep).

From FIG. 12A and FIG. 12B, it is understood that there is a higher vibration attenuation effect if the depth of a groove is deeper, and that it is possible to control vibration attenuation without drastically attenuating vibration, if there are dual grooves instead of a single groove.

Further, taking into account that the attenuation occurs within the range of a groove, setting a wide groove width causes, compared to a case where the width of the groove is narrow, the attenuation to proceed moderately.

As described above, in order to avoid drastic attenuation so as not to effect the main vibration of the resonator element, and to let it attenuate effectively, it is desirable to reduce the thickness of the resonator element at the groove, as well as to similarly increase the width of the groove toward the marginal edge of the resonator element.

Figure 13:
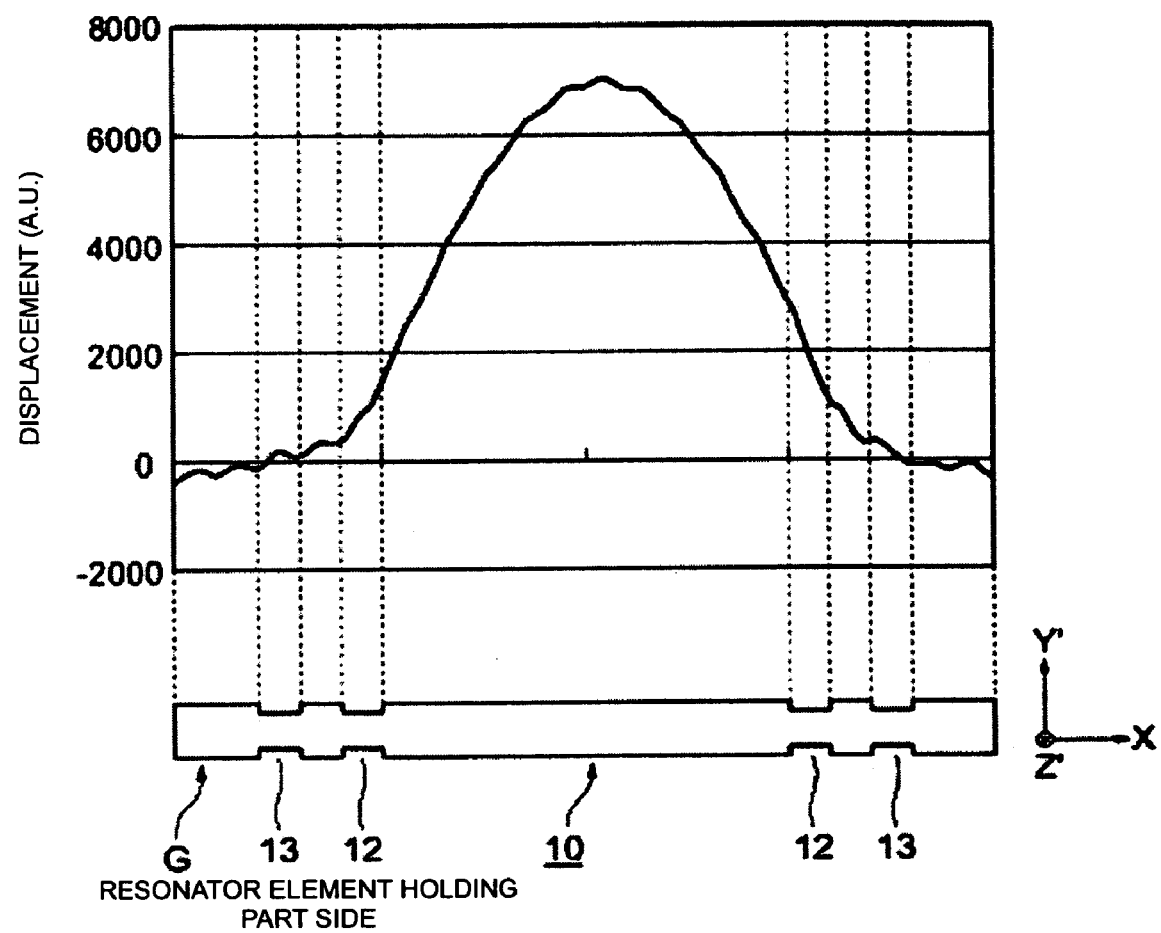
FIG. 13 is a displacement distribution map of the analysis done by the Finite Element Method, showing the attenuation status of the thickness shear vibration.

FIG. 13 shows results of the analysis of a vibration displacement of the resonator element 10, which is shown in FIG. 11, whereon the first groove 12 and the second groove 13 are applied, using the Finite Element Method.

As shown, the vibration displacement is small at the resonator element holding part G of the resonator element 10, and the vibration displacement at the center part of the resonator element is large. Consequently, it shows that a desirable resonator element is obtained, without the attenuation at the groove obstructing the main vibration.

The Third Exemplary Embodiment

Hereafter, the third exemplary embodiment, where three grooves are provided in a resonator element, is described.

Figure 14A:
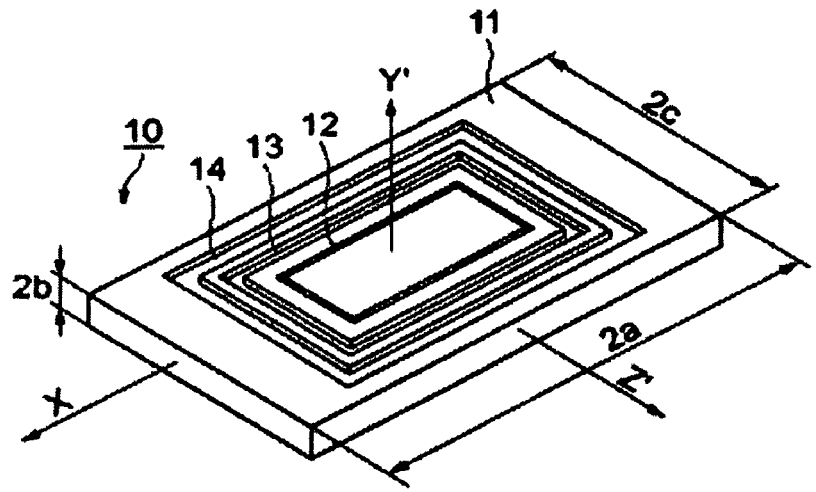
FIGS. 14A, 14B and 14C are schematics of a quartz crystal resonator element describing another exemplary embodiment.
Figure 14B:
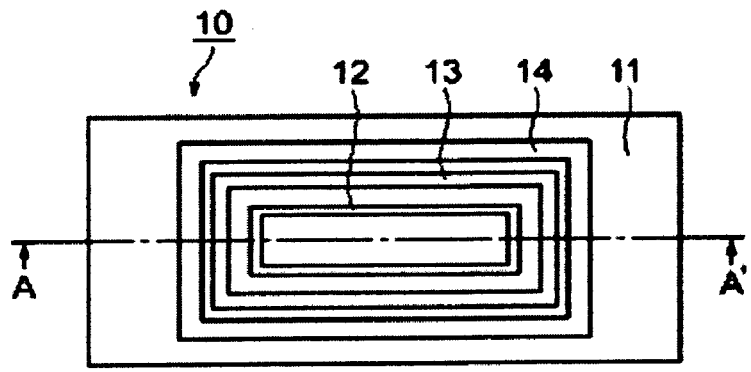
Figure 14C:
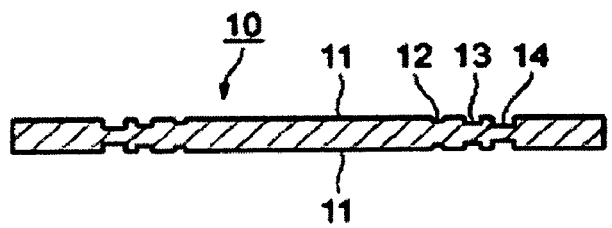

FIGS. 14A-14C and FIG. 15 are schematic drawings of the resonator element describing the third exemplary embodiment. FIG. 14A is a perspective view of the resonator element, FIG. 14B is a top view of the resonator element, FIG. 14C is a sectional drawing of the section A-A in FIG. 14B, and FIG. 15 is an enlarged drawing of the groove part in FIG. 14C.

In FIGS. 14A-14C and FIG. 15, the same drawing elements are used for the same structure as those of the first exemplary embodiment and the second exemplary embodiment.

As shown in FIG. 14A, as well as in FIG. 14B, in the main surface 11 of the resonator element 10, circumference grooves, which are the first groove 12, the second groove 13, and the third groove 14, are formed so as to surround the center part of the main surface 11 with a quadrangle. The first grooves 12, the second grooves 13, and the third grooves 14 are formed on the front and back of the main surfaces of the resonator element 10 so as to be opposite to each other.

The width W1 of the first groove 12 is formed to be about 20 μm, the width W2 of the second groove 13 is formed to be 40 μm, and a width W3 of the third groove 14 located on the outermost side of the main surface 11 of the resonator element 10 is formed to be 65 μm, which is a larger value than the thickness of the resonator element 10 (having a relation of W1<W2<W3).

Further, the depth of the first grooves 12 is 3 μm for both front and back, and the thickness T1 of the resonator element at the first groove 12 is formed to be about 56 μm. The depth of the second grooves 13 is 5 μm for both front and back, and the thickness T2 of the resonator element at the second groove 13 is formed to be about 52 μm. The depth of the third grooves 14 is 6 μm for both front and back, and a thickness T3 of the resonator element at the third groove 14 is formed to be about 50 μm (having a relation of T1>T2>T3).

A distance L1 between the first groove 12 and the second groove 13 is formed to be 40 μm, and a distance L2 between the second groove 13 and the third groove 14 is formed to be 20 μm (having a relation of L1>L2).

As described above, the widths of the grooves widen gradually toward the marginal edge of the resonator element, while the thicknesses at the grooves become thinner toward the marginal edge of the resonator element. Moreover, the distances between the adjacent grooves narrow toward the marginal edge of the resonator element.

The reason for the widths of the grooves widening gradually toward the marginal edge of the resonator element 10, as well as thickness at the grooves growing thinner toward the marginal edge of the resonator element is as described in the second exemplary embodiment. Furthermore, the reason for the distances between the adjacent grooves narrowing gradually toward the marginal edge of the resonator element 10, is derived from the following ideas: in order not to drastically conduct vibration attenuation at the grooves that are close to the center part of the resonator element, the distance between the grooves are set wide; and in order to obtain a sufficient attenuation at the edge of the resonator element, the distance between the grooves is set narrower.

Based on such a structure, it is possible to obtain a desirable resonator element, that reduces a drastic attenuation effecting the main vibration, and reduces the displacement at the marginal edge.

The Fourth Exemplary Embodiment

Figure 16A:
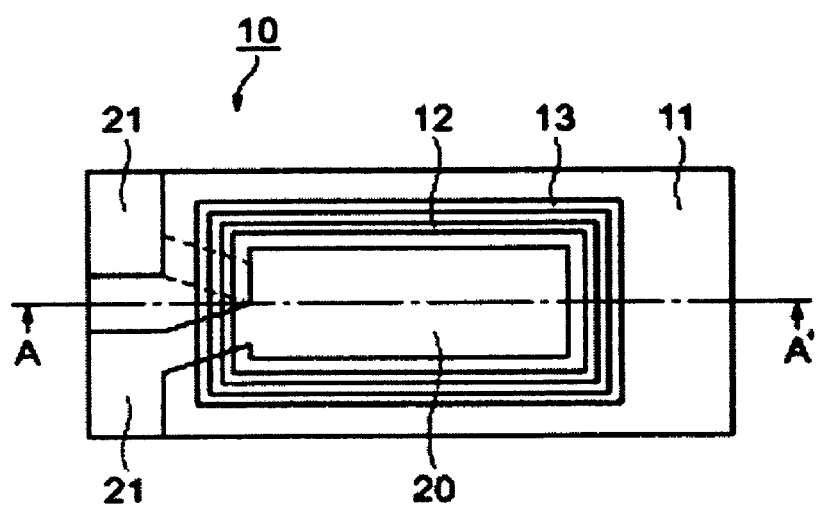
FIGS. 16A and 16B are schematics showing an application example of the piezoelectric resonator element.
Figure 16B:
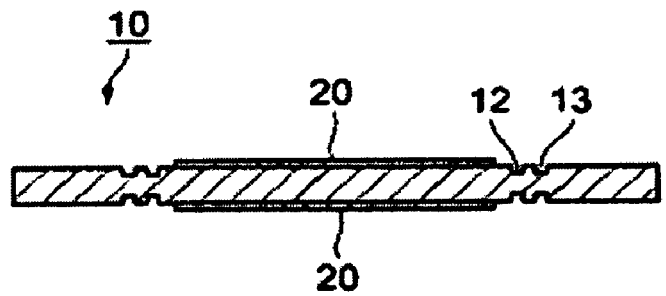

FIG. 16A and FIG. 16B show one exemplary embodiment of the resonator element 10. On a resonator element, an excitation electrode and a connecting-electrode that is connected to the excitation electrode, are formed. FIG. 16A is a top view drawing of the resonator element, FIG. 16B is a sectional drawing of the section A-A in FIG. 16A.

On the front and back of the resonator element 10, the first groove 12 and the second groove 13 are formed, surrounding the center part of it and being opposite to each other in the direction of the thickness. In the center part of the main surface 11, surrounded by the first groove 12, excitation electrodes 20 are applied so as to be opposite to each other in the direction of the thickness of the resonator element 10. Moreover, connecting-electrodes 21, which extend from the excitation electrodes 20 to the marginal edge of the resonator element 10, are formed. The connecting-electrodes 21 are formed on the front and back of the resonator element 10, and by fixing the edge of the resonator element 10 to the other material via a conductive adhesive, it is possible fix the other material and the resonator element 10 to each other, as well as to have an electric conduction with the excitation electrode 20.

The excitation electrode 20 and the connecting-electrode 21 are formed with electrode-suited materials such as Cr and Au, or, Cr and Ag, respectively, and are applied with methods such as vacuum evaporation or sputtering, etc. In the present exemplary embodiment, the excitation electrode 20 is formed in a rectangular shape, but it may be formed in any shape.

As described, by forming the groove 12 and 13 so as to surround the center part of the piezoelectric resonator element 10, it is possible to sufficiently attenuate the vibration of the marginal edge of the resonator element 10, and to provide a piezoelectric resonator element, in which the vibration does not, generally, leak from the resonator element 10 to the holding part, when the resonator element 10 is fixed and held at the connecting-electrode 21, and which has a desirable electric characteristic that does not effect the main vibration.

The Fifth Exemplary Embodiment

FIG. 17A and FIG. 17B are schematics showing an exemplary embodiment of a piezoelectric resonator using the piezoelectric resonator element. FIG. 17A is a perspective view of the piezoelectric resonator. FIG. 17B is a sectional drawing of section B-B in FIG. 17A.

In a piezoelectric resonator 50, the piezoelectric resonator element 10 is fixed and held to a housing container 51 that is, for example, made with ceramics, via a conductive adhesive 52. The piezoelectric resonator 50 is structured to have a cover (not shown), which is adhered to the upper surface of the housing container 51 and hermetically seals the housing container 51 in vacuum or with an inert gas atmosphere. In the piezoelectric resonator element 10, the excitation electrodes 20 are formed in the center part, being opposite to each other in the direction of the thickness, and the connecting-electrodes 21 that extend from the excitation electrode 20 to the marginal edge of the piezoelectric element 10 are formed. The first grooves 12 and the second grooves 13 are formed, being respectively opposite to each other in the direction of the thickness, so as to surround the excitation electrodes 20 of the piezoelectric resonator element 10. The piezoelectric element 10 is fixed and held at a holding part 53 of the housing container 51 via the conductive adhesive 52, and is electrically connected to the excitation electrodes 20 and to the wiring (not shown) of the housing container 51.

As described, by forming the groove 12 and 13 so as to surround the center part of the piezoelectric resonator element 10, it is possible to sufficiently attenuate the vibration of the marginal edge of the resonator element 10, and to provide the piezoelectric resonator element 50, in which the vibration does not, substantially, leak when the resonator element 10 is fixed and held at the connecting-electrode 21, and which has a desirable electric characteristic that does not, generally, effect the main vibration.

The Sixth Exemplary Embodiment

Figure 18A:
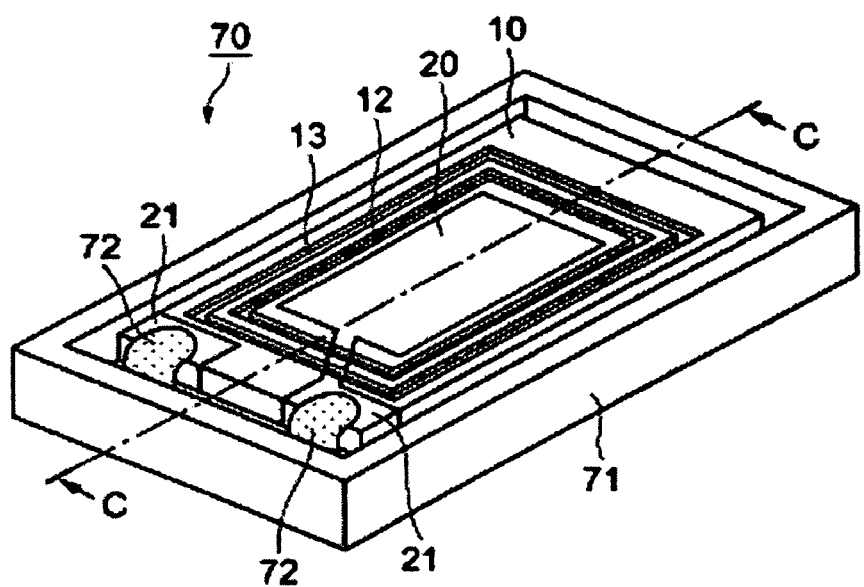
FIGS. 18A and 18B are schematics of the piezoelectric oscillator.
Figure 18B:
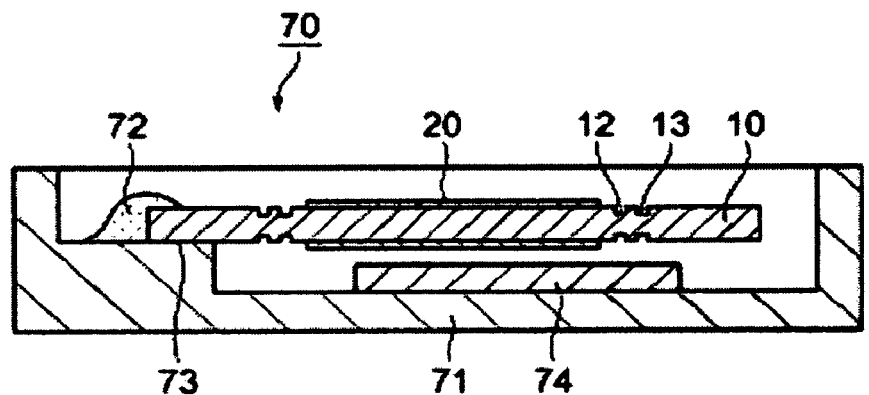

FIG. 18A and FIG. 18B are schematics showing an exemplary embodiment of a piezoelectric oscillator using the piezoelectric resonator element. FIG. 18A is a perspective view of the piezoelectric oscillator, FIG. 18B is a sectional drawing of the section C-C in FIG. 18A.

In a piezoelectric resonator 70, the piezoelectric resonator element 10 is fixed and held to a housing container 71 that is, for example, made with ceramics, via a conductive adhesive 72. The piezoelectric resonator 70 fixes a circuit part 74 that oscillates the piezoelectric resonator 10, and has a cover (not shown) that is adhered to the upper surface of the housing container 71, and hermetically seals the housing container 71 in vacuum or with an inert gas atmosphere.

In the piezoelectric resonator element 10, the excitation electrodes 20 are formed in the center part, being opposite to each other in the direction of the thickness, and the connecting-electrodes 21 that extend from the excitation electrode 20 to the marginal edge of the piezoelectric element 10 are formed. The first grooves 12 and the second grooves 13 are formed, being respectively opposite to each other in the direction of the thickness, in a way to surround the excitation electrodes 20 of the piezoelectric resonator element 10. The piezoelectric element 10 is fixed and held at a holding part 73 of the housing container 71 via the conductive adhesive 72, and is electrically connected to the excitation electrodes 20, the wiring (not shown) of the housing container 71, and the circuit part 74.

As described, by forming the groove 12 and 13 so as to surround the center part of the piezoelectric resonator element 10, it is possible to sufficiently attenuate the vibration of the marginal edge of the resonator element 10, and to provide the piezoelectric oscillator 70, in which the vibration does not, substantially, leak when the resonator element 10 is fixed and held at the connecting-electrodes 21, and which has a desirable electric characteristic that does not, generally, effect the main vibration.

Exemplary embodiments of the present invention are not limited to a forming of a groove so as to surround the central part of a main surface of a resonator element, and may include a forming of grooves on both sides of the resonator element in the direction of the long side, so that the grooves face toward each other sandwiching the center part of the resonator. That is to say, the structure without grooves, which face toward each other, on both sides of the resonator element in the direction of the short side, may be included.

Moreover, in the above-mentioned exemplary embodiments, descriptions were made taking a quartz crystal as a material for the piezoelectric resonator element. However, the exemplary embodiments are also possible using other piezoelectric materials such as Lithium Tantalate, Lithium Niobate, or Lead Zirconium Titanate (PZT), etc., and the same, general, effect can be achieved.

What is claimed is:

1. A piezoelectric resonator element, comprising:
   main surfaces; and
   a groove formed on at least one of the main surfaces;
   the piezoelectric resonator element capable of forming a thickness shear vibration as a main vibration;
   one part of the groove facing another part of the groove, the groove sandwiching a center part of the piezoelectric resonator element, and the groove surrounding the center part of the piezoelectric resonator element;
   a thickness of the piezoelectric resonator element at the groove being between 96% and at least 80% of a thickness of the center part.

2. The piezoelectric resonator element according to claim 1, further comprising:
   a pair of excitation electrodes, structured in an arbitrary shape in the two center parts of the piezoelectric resonator element and being opposite to each other in a thickness direction, and a connecting electrode connected to at least one of the pair of the excitation electrodes and extending to a marginal edge of the piezoelectric resonator element.

3. A piezoelectric resonator having the piezoelectric resonator element according to claim 2, further comprising:
   a holding part to fix and hold the piezoelectric resonator element so as to be electrically connected at an edge.

4. A piezoelectric oscillator having the piezoelectric resonator element according to claim 2, further comprising:
   a circuit part to oscillate the piezoelectric resonator element, and a holding part to fix and hold the piezoelectric resonator element at an edge while electrically connecting the piezoelectric resonator element to the circuit part.

5. A piezoelectric resonator element, comprising:
   main surfaces; and
   a groove formed on at least one of the main surfaces;
   the piezoelectric resonator element capable of forming a thickness shear vibration as a main vibration;
   one part of the groove facing another part of the groove, the groove sandwiching a center part of the piezoelectric resonator element, and the groove surrounding the center part of the piezoelectric resonator element;

a thickness of the piezoelectric resonator element at the groove being between 96% and at least 70% of a thickness of the center part;

a plurality of the grooves being formed in a plurality of rows defined by intervals from the center part of the piezoelectric resonator element toward a marginal edge; and the width of the groove located at the outermost side of the main surface being larger than or equal to the thickness of the center part.

6. The piezoelectric resonator element according to claim 5, the plurality of grooves being structured so that the thickness at each of the grooves sequentially becomes thinner toward the marginal edge of the piezoelectric resonator element.

7. The piezoelectric resonator element according to claim 5, the plurality of grooves being structured to define at least three rows, further comprising:

a distance separating adjacent grooves, the distance between the adjacent grooves sequentially narrowing toward the marginal edge of the piezoelectric resonator element.

8. The piezoelectric resonator element according to claim 5, the plurality of grooves being structured so that the widths at each of the grooves sequentially widen toward the marginal edge of the piezoelectric resonator element.

9. The piezoelectric resonator element according to claim 5, the plurality of grooves being structured so that the thickness at each of the grooves sequentially becomes thinner toward the marginal edge of the piezoelectric resonator element, and the widths at each of the grooves is wider toward the marginal edge of the piezoelectric resonator element.

10. The piezoelectric resonator element according to claim 5, the plurality of grooves being structured to define at least three rows, further comprising:

a distance separating adjacent grooves, the distance between the adjacent grooves sequentially narrowing toward the marginal edge of the piezoelectric resonator element, and the thickness at each of the grooves being thinner toward the marginal edge of the piezoelectric resonator element.

11. The piezoelectric resonator element according to claim 5, the plurality of grooves being structured to define at least three rows, further comprising:

a distance separating adjacent grooves, the distance between the adjacent grooves sequentially narrowing toward the marginal edge of the piezoelectric resonator element, and the widths at each of the grooves widening toward the marginal edge of the piezoelectric resonator element.

12. The piezoelectric resonator element according to claim 5, the plurality of grooves being structured to define at least three rows, further comprising:

a distance separating adjacent grooves, the distance between the adjacent grooves sequentially narrowing toward the marginal edge of the piezoelectric resonator element, the thickness at each of the grooves being thinner toward the marginal edge of the piezoelectric resonator element, and the widths at each of the grooves widening toward the marginal edge of the piezoelectric resonator element.

13. The piezoelectric resonator element according to claim 5, further comprising:

a pair of excitation electrodes, structured in an arbitrary shape in the two center parts of the piezoelectric resonator element and being opposite to each other in a thickness direction, and a connecting electrode connected to at least one of the pair of the excitation electrodes and extending to a marginal edge of the piezoelectric resonator element.

14. A piezoelectric resonator having the piezoelectric resonator element according to claim 13, further comprising:

a holding part to fix and hold the piezoelectric resonator element so as to be electrically connected at an edge.

15. A piezoelectric oscillator having the piezoelectric resonator element according to claim 13, further comprising:

a circuit part to oscillate the piezoelectric resonator element, and a holding part to fix and hold the piezoelectric resonator element at an edge while electrically connecting the piezoelectric resonator element to the circuit part.

* * * * *